United States Patent [19]
Young et al.

[11] Patent Number: 6,083,884
[45] Date of Patent: *Jul. 4, 2000

[54] A-AXIS HIGH TEMPERATURE SUPERCONDUCTING FILMS WITH PREFERENTIAL IN-PLANE ALIGNMENT

[75] Inventors: Kwo-Hsiung Young; Jonathan Zan-Hong Sun, both of Goleta, Calif.

[73] Assignee: Superconductor Technologies, Inc., Santa Barbara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/077,709

[22] Filed: Jun. 15, 1993

Related U.S. Application Data

[63] Continuation of application No. 07/714,139, Jun. 11, 1991, abandoned.

[51] Int. Cl.$^7$ .............................. B32B 9/00; H01L 39/00
[52] U.S. Cl. ........................... 505/238; 505/701; 428/930
[58] Field of Search ............................... 505/1, 701, 702, 505/703, 704, 238; 428/688, 689, 210, 930

[56] References Cited

U.S. PATENT DOCUMENTS

| | | | |
|---|---|---|---|
| 4,962,086 | 10/1990 | Gallagher et al. | 505/1 |
| 5,047,385 | 9/1991 | Beasley | 505/1 |
| 5,151,408 | 9/1992 | Tanaka | 505/1 |

OTHER PUBLICATIONS

Eom, et al. "Epitarial & Smooth Films of a–Axis $YBa_2Cu_3O_7$" Science, Sep. 28, 1990 vol. 249 pp. 1549–1552.

Inam, et al. a–axis Oriented Epitaxial $YBa_2Cu_3O_{7-x}$–$PrBa_2Cu_3O_{7-y}$ Heterostructures, Appl. Phys. Lett. 57(23), Dec. 3, 1990 pp. 2484–2486.

Char, et al. "Growth Properties of Sputtered High Tc Oxide Thin Films," IEEE Trans., on May, vol. 25, No. 2 Mag. 1989 pp. 2422–2425.

Sahu et al., "Chemistry of High Temp Superconductors II" ACS, 1988 Chapter 1, pp. 1–15.

"Cuprate Superconductors—Record 133 K Achieved with Mercury", C&EN, May 10, 1993 pp. 4–5.

Doss, "Engineer's Guide to High—Temperature Superconductivity," John Wiley & Sons, 1989, pp. 266–269 No Month Data!.

Microelectronic Manufacturing & Testing 1985 Desk Manual, p. 79 (vol. 8 No. 3), No Month Data!.

Geball, Science vol. 259, Mar. 12, 1993 (pp. 1550–1551).

*Primary Examiner*—Roy V. King
*Attorney, Agent, or Firm*—Lyon & Lyon LLP

[57] ABSTRACT

An a-axis high temperature superconducting film having preferential in-plane orientation is formed. In the preferred embodiment, an a-axis film has substantial amounts of superconductor oriented with its c-axis in a unified direction. YBCO on neodymium gallate (110) plane has resulted in a high temperature superconductor with over 80% by volume being a-axis with c-axis in-plane alignment in one preferential direction. These films are epitaxial. The preferred method of film growth is for in situ growth by laser ablation. Preferably, the a-axis film is nucleated by laser ablation on onto a substrate which is at a temperature of 50 to 100° C. less than the optimal substrate temperature for c-axis growth. Optionally, once a-axis nucleation has begun, the substrate temperature may be increased to optimize superconductor properties.

10 Claims, 1 Drawing Sheet

6,083,884

A-AXIS HIGH TEMPERATURE SUPERCONDUCTING FILMS WITH PREFERENTIAL IN-PLANE ALIGNMENT

This is a continuation of application Ser. No. 07/714,139, filed on Jun. 11, 1991, now abandoned.

FIELD OF THE INVENTION

This invention relates to high temperature superconductors and methods for their growth. More particularly, it relates to high temperature superconductors with their a-axis oriented perpendicular to the substrate, and having substantial in-plane alignment of the c-axis of the superconductor.

BACKGROUND OF THE INVENTION

Starting in early 1986, with the announcement of a superconducting material having a critical temperature (the temperature at which a specimen undergoes the phase transition from a state of normal electrical resistivity to a superconducting state) of 30K (See e.g., Bednorz and Muller, Possible High Tc superconductivity in the Ba-La-Cu-O System, Z.Phys. B-Condensed Matter 64, 189–193 (1986)) materials having successively higher transition temperatures have been announced. In 1987, the so called YBCO superconductors were announced, consisting of a combination of alkaline earth metals and rare earth metals such as barium and yttrium in conjunction with copper. See, e.g., Wu, et al, Superconductivity at 93K in a New Mixed-Phase Y-Ba-Cu-O Compound System at Ambient Pressure, Phys. Rev. Lett., Vol. 58, No. 9, pp. 908–910 (1987). Thirdly, compounds containing bismuth were discovered. See e.g, Maeda, A New High-Tc Oxide Superconductor Without a Rare Earth Element, J.J. App. Phys. 37, No. 2, pp. L209–210 (1988) and Chu, et al, Superconductivity up to 114K in the Bi-Al-Ca-Ba-Cu-O Compound System Without Rare Earth Elements, Phys. Rev. Lett. 60, No. 10, pp. 941–943 (1988). Finally, superconductors including thallium have been prepared, generally where the compositions have various stoichiometries of thallium, calcium, barium, copper and oxygen. To date, the highest transition temperatures for superconductors have been observed in thallium containing compounds. See, e.g., G. Koren, A. Gupta and R. J. Baseman, Appl.Phys.Lett. 54, 1920 (1989).

A unifying characteristic of these newly discovered superconductors is that they all include copper oxide ("CuO") planes. While the size of the superconducting crystals is often small, sometimes on the order of only microns, when looked at locally, the CuO planes are essentially infinite. If the CuO planes are oriented parallel to the substrate, the film is termed a c-axis film. This plane is sometimes called the basal plane. However, if the CuO planes are oriented perpendicular to the substrate, the film is termed an a-axis film. FIG. 1 shows a c-axis film. The crystal 10 is shown having an array of copper atoms 12. To maintain generality, the other constituents of the superconductor are not shown. The plane 14 shown in phantom is drawn through one of the essentially infinite CuO planes. The plane 14 is substantially parallel to the surface of the substrate 16.

FIG. 2 shows an a-axis high temperature superconducting film. Again, copper atoms 12 are shown defining the superconducting crystal structure. The plane 18 shown in phantom shows one of the infinite CuO planes. The c-axis of the superconductor of FIG. 2 is oriented parallel to the substrate 16. As drawn in FIG. 2, the superconductor has a single orientation of the c-axis (i.e. it has in-plane alignment or preferential orientation). However, in the prior art, a-axis films have a plurality of domains, some of which have a c-axis as shown, and some of which have a c-axis at an angle, typically 90°, to the domain shown. When multiple, unoriented domains exist, the film is said to be a polydirectional a-axis film.

The crystal structure for the various high temperature superconducting crystals have been characterized. Taking the case of YBCO, it is said to have a perovskite crystal structure, so named after the mineral perovskite (calcium titanite). FIG. 3 shows the unit cell for a YBCO superconductor. There are three orthoganol axis, the A, B and C axis. The shoe box shaped structure has an A dimension of 3.84 Å, a B dimension of 3.88 Å and a C dimension of 11.7 Å. When formed as a c-axis film, the long c-axis is oriented perpendicular to the substrate 16 (See FIG. 1). When oriented as an a-axis film, the long C dimension is oriented parallel to the substrate 16 (See FIG. 2).

Many applications for high temperature superconductors require c-axis oriented films. The superconducting current ("supercurrent") preferentially flows in a direction parallel to the CuO plane. In the case of a c-axis film, the supercurrent flows parallel to the substrate 16, and thus, may flow for relatively long uninterrupted distances. C-axis films are particularly useful for microwave device applications. For other applications, it is desirable to have an a-axis oriented film. As shown in FIG. 2, the CuO planes are oriented perpendicular to the substrate. This makes for a large anisotropy in resistance to supercurrent flow. Flow in the direction parallel to the CuO plane may be readily accomplished, but flow perpendicular to the CuO plane must be by the tunnelling phenomena due to the nature of weakly coupled superconducting state between adjacent CuO planes, resulting in so called tunneling current.

Polydirectional a-axis films have been grown previously. Typically, numerous discrete domains exist where the superconductor is a-axis oriented perpendicular to the substrate, but the c-axis of the various domains are not parallel to one another. If the film is epitaxial, the superconductor will be oriented relative to the crystal structure of the substrate, in which case the various domains will be oriented with equal probability in one of two directions.

Techniques for growing pure a-axis films used in the past have included: RF Magnetron Sputtering With Post-Annealing on $SrTiO_3$ (001), K. Shar, et al, IEEE Trans. Magn. 25, 2422 (1989); Off-Axis Magnetron Sputtering on Both $SrTiO_3$ (001) and $LaAlO_3$ (001), C. B. Eom, A. F. Marshall, S. S. Laderman, R. D. Jacowitz and T. H. Geballe, Science 249, 1549 (1990); and Laser Ablation on $PrBa_2Cu_3O_{7-\delta}$ Buffered $SrTiO_3$ (001), A. Inam, C. T. Rogers, R. Remesh, L. Farrow, K. Remeshnig, D. Hart and T. Venjatesan, Applied Physics Letters 57, 2484 (1990) and R. Ramesh, A. Inam, D. L. Hart and C. T. Rogers, Physca C 170, 325 (1990). The in-plane orientation of the superconducting film with respect to the substrate is uncontrolled, with the c-axis of different a-axis domains orienting themselves in two different directions. The C. B. Eom reference, above, suggests use of lower substrate temperatures in a laser ablation device to promote a-axis growth.

None of the prior art references has grown a-axis superconducting films with a preponderance of the superconducting domains having their c-axis aligned in one preferential direction (i.e. having in-plane alignment). This is so despite the clear desirability of such a result.

SUMMARY OF THE INVENTION

An a-axis high temperature superconductor which has substantial in-plane alignment is disclosed. In accordance with this invention, the a-axis high temperature superconducting film is formed on a substrate having an anisotropic surface cell. In the preferred embodiment, a superconductor such as YBCO or the thallium containing superconductors are grown on the (110) plane of neodymium gallate ($NdGaO_3$). The surface cell of neodymium gallate (110) has an anisotropic surface cell. Epitaxial a-axis YBCO films had been grown on the (110) plane of neodymium gallate with substantial in-plane alignment. The preferred method of growing a-axis oriented films utilizes laser ablation onto a substrate at a temperature which promotes a-axis growth. This temperature is typically lower than that which promotes c-axis growth. Preferably, a substrate temperature of 50 to 100° C. below optimal for c-axis growth is desired to promote a-axis nucleation. Subsequently, the substrate temperature may be raised to improve superconducting properties of the film.

It is an object of this invention to grow a-axis high temperature superconducting films with substantial in-plane alignment.

It is yet a further object of this invention to grow preferentially oriented high-temperature superconductors on substrates with anistropic sized surface cells.

It is yet a further object of this invention to form an a-axis film of YBCO or thallium superconductor with substantial in-plane alignment on a neodymium gallate (110) plane.

DETAILED DESCRIPTION

Figure 1:
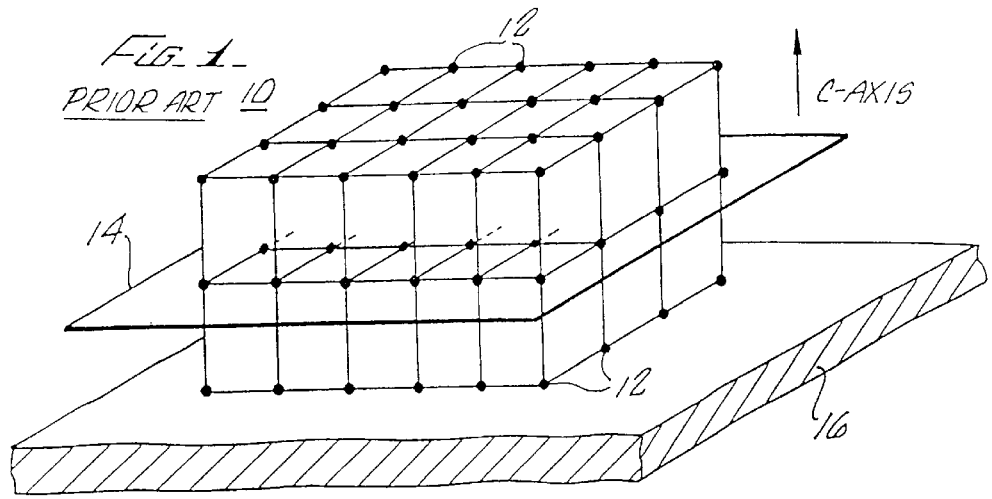
FIG. 1 shows a perspective view of a c-axis oriented high temperature superconducting film on a substrate.
Figure 2:
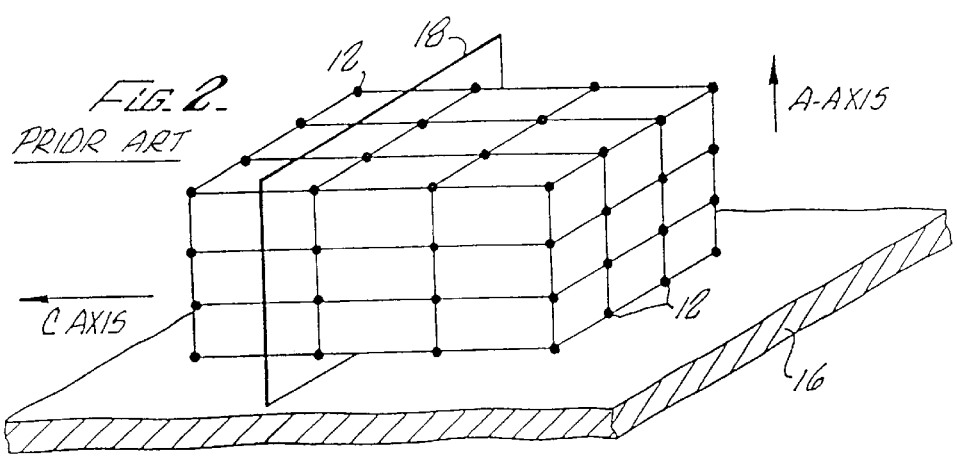
FIG. 2 shows a perspective view of an a-axis high temperature superconducting film on a substrate.
Figure 3:
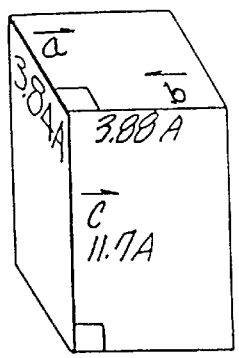
FIG. 3 shows a perspective view of a unit cell for a YBCO superconductor.
Figure 4:
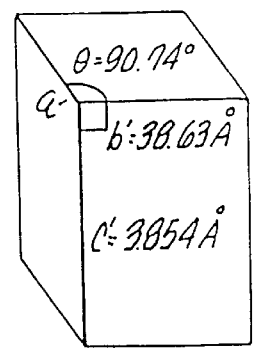
FIG. 4 shows a perspective view of the reduced unit cell for neodymium gallate.

Neodymium gallate has an orthorhombic perovskite structure with lattice constants a=5.428 Å, b=5.499 Å, and c=7.708 Å. A pseudo-cubic (perovskite-like) unit cell can be constructed with a'=b'=3.8563 Å and c'=3.854 Å. Both a' and b'-axis are perpendicular to c'-axis, and the angle Θ between a' and b' is 90.74°. The plane defined by the a' and b'-axis defines a rhombus. The structure defined by the b'–c'-axis is a rectangle. Neodymium gallate (110) has the plane defined by the b' and c'-axis at its surface.

YBCO superconducting films have been grown on the (110) plane of neodymium gallate. In the preferred embodiment, the films were in situ deposited by laser ablation from a stoichiometric target. A Siemens XP2020 XeCl Excimer Laser (308 nm) was used at a repetition rate of 5 Hz. The laser fluence on the target was maintained at around 5 joules/$cm^2$. The target is commercially available from Superconductive Components Inc. The preferred targets are stoichiometric and are fabricated by cold pressing followed by sintering.

The substrate is heated in the laser ablation apparatus prior to deposition of the film. For films grown with a substrate temperature between 810 and 830° C., the majority of the film is c-axis textured, with small amounts of a-axis grains being formed. In the preferred embodiment, the substrate temperature is initially made lower than this temperature, preferably by from 50 to 100° C., to promote a-axis nucleation. Since the substrate temperature was measured by a thermocouple attached to the heater block, the actual temperature at the substrate surface may be from 20 to 50° C. lower. In the preferred embodiment, the substrate temperature was held at 700° C. during deposition. If desired, following nucleation of the a-axis film, the substrate temperature may be raised to ordinary processing temperatures to enhance the film crystallinity and superconducting properties of the film. For films made to date, the oxygen pressure was maintained at 600 mtorr during film growth and was increased to one atmosphere immediately after deposition. Typical film thicknesses have been between 1,500 and 2,500 Å. The various processing parameters relating to laser ablation may be chosen as known to those skilled in the art to optimize the properties of the film.

Films grown by the above described method have generated a-axis films having substantial in-plane alignment of the C-axes. Analysis of these films indicate that the film is predominately a-axis in texture, having greater than 90% a-axis, with the remaining amount being c-axis oriented. Out of the a-axis material, it is believed that over 90% has its c-axis aligned in one direction. Overall, between 80 to 90% by volume of the superconductor film has its a-axis grains aligned with their c-axis close to a single direction in the plane.

Considering superconducting properties, the film had a $T_c$ of 89.5K, which is 1 to 2K lower than a typical $T_c$ for a c-axis oriented film of the same material on the same substrate. However, the transition width for $T_c$ was much broader than is typically observed in a c-axis film of comparable thickness.

Though the invention has been described with respect to a specific preferred embodiment, many variations and modifications may become apparent to those skilled in the art. It is therefore that the appended claims be interpreted as broadly as possible in view of the prior art to include all such various and modifications.

We claim:

1. A superconductive device comprising:
    a high temperature superconductive film having at least 80% by volume a-axis oriented and c-axis aligned in one preferential direction on a substrate having an anisotropic surface cell,
    wherein the high temperature superconductive film comprises a $YBa_2Cu_3O_x$ superconductor and the substrate comprises a $NdGaO_3$ substrate.

2. The superconductive device of claim 1 wherein the substrate is $NdGaO_3$ (110).

3. The superconductive device of claim 1 wherein the film is epitaxial to the substrate.

4. A superconductive device comprising:
    a high temperature superconductive film including a-axis oriented domains, where the a-axis domains have a c-axis alignment in one preferential direction on
    a $NdGaO_3$ substrate,
    wherein the high temperature superconductive film comprises a YBCO superconductor.

5. The superconductive device of claim 4 wherein the substrate surface is a (110) plane.

6. A superconductive device comprising:
    a high temperature superconductive film having at least 80% by volume a-axis oriented and c-axis aligned in one preferential direction on a substrate having an anisotropic surface cell,
    wherein the high temperature superconductive film comprises a thallium containing superconductor and the substrate comprises a $NdGaO_3$ substrate.

7. The superconductive device of claim 6 wherein the substrate is $NdGaO_3$ (110).

8. The superconductive device of claim 6 wherein the film is epitaxial to the substrate.

9. A superconductive device comprising:

a high temperature superconductive film including a-axis oriented domains, where the a-axis domains have a c-axis alignment in one preferential direction on a NdGaO$_3$ substrate, wherein the high temperate superconductive film comprises a thallium containing superconductor.

10. The superconductive device of claim 9 wherein the substrate surface is a (110) plant.

* * * * *

UNITED STATES PATENT AND TRADEMARK OFFICE
CERTIFICATE OF CORRECTION

PATENT NO. : 6,083,884  
DATED : July 4, 2000  
INVENTOR(S) : Kwo-Hsiung Young et al.

Page 1 of 1

It is certified that error appears in the above-identified patent and that said Letters Patent is hereby corrected as shown below:

<u>Column 3,</u>
Line 23, please delete "sized".
Line 43, please change "3.8563" to -- 3.863 --.

Signed and Sealed this

Fourteenth Day of May, 2002

Attest:

Attesting Officer

JAMES E. ROGAN
*Director of the United States Patent and Trademark Office*